United States Patent [19]

Cho

[11] Patent Number: 5,863,816
[45] Date of Patent: Jan. 26, 1999

[54] FABRICATION METHOD FOR CHIP SIZE SEMICONDUCTOR PACKAGE

[75] Inventor: Jae-Weon Cho, Choongcheongbuk-Do, Rep. of Korea

[73] Assignee: LG Semicon Co., Ltd., Chungcheongbuk-Do, Rep. of Korea

[21] Appl. No.: 937,511

[22] Filed: Sep. 25, 1997

[30] Foreign Application Priority Data

Dec. 28, 1996 [KR] Rep. of Korea .................. 1996-75052

[51] Int. Cl.⁶ .................. H01L 21/326; H01L 21/479
[52] U.S. Cl. .................. 438/123; 438/466; 205/123; 205/128
[58] Field of Search .................. 438/466, 123; 205/123, 128, 272, 266; 204/194

[56] References Cited

U.S. PATENT DOCUMENTS

| | | |
|---|---|---|
| 3,901,785 | 8/1975 | Buzhinskaya et al. . |
| 5,459,102 | 10/1995 | Shibata et al. . |
| 5,529,682 | 6/1996 | Knapp et al. . |
| 5,541,447 | 7/1996 | Maejima et al. . |
| 5,580,432 | 12/1996 | Shibata et al. . |
| 5,736,428 | 4/1998 | Kassai et al. . |

OTHER PUBLICATIONS

Lowenheim, Frederick A., Electroplating, McGraw–Hill, New York, pp. 152–155, 1978.

*Primary Examiner*—John F. Niebling
*Assistant Examiner*—Jositta Jones
*Attorney, Agent, or Firm*—Morgan, Lewis & Bockius LLP

[57] ABSTRACT

A fabrication method for a chip size semiconductor package includes the steps of bonding conductive wires on bonding pads formed on an upper surface of a semiconductor chip, putting the semiconductor chip including the bonded conductive wires in an electrolyzer containing an electrolytic solution in such a manner that one end of each of the conductive wires is exposed outside of the electrolytic solution, attaching a plating electrode to an inner wall of the electrolyzer, attaching a conductive plate to serve as a common electrode to the exposed one end of each of the conductive wires; and connecting the conductive plate and the outer wall of the electrolyzer to an electric current source.

14 Claims, 4 Drawing Sheets

FABRICATION METHOD FOR CHIP SIZE SEMICONDUCTOR PACKAGE

This application claims the benefit of Korean Application Number 75052/1996 filed on Dec. 28, 1996, which is hereby incorporated by reference.

BACKGROUND OF THE INVENTION

1. Field of the Invention

The present invention relates to a fabrication method for a chip size semiconductor package (CSP), and more particularly, to an improved fabrication method for a CSP in which conductive wires are bonded directly on bonding pads formed on a semiconductor chip.

2. Description of the Prior Art

The conventional CSP fabrication method will now be described in detail with reference to FIGS. 1A through 1F.

First, as shown in FIG. 1A, a bonding pad 13 is formed on a semiconductor chip 11 (or a wafer), and a passivation layer 15 is formed on the upper surface of the semiconductor chip 11 except the bonding pad 13. Then, as shown in FIG. 1B, a first conductive layer 17 formed of TiW and a second conductive layer 19 formed of Au are sequentially deposited by a sputtering method on the bonding pad 13 and the passivation layer 15. As shown in FIG. 1C, one end of a conductive wire 21 formed of gold (Au) is bonded on the surface of the second conductive layer 19 above the bonding pad 13, and then the conductive wire 21 is cut to be formed in a straight or curved line of 1 to 2 mm. The conductive layer 19 is used as a common terminal when a post electroplating process is carried out.

As shown in FIG. 1D, a photoresist 23 is formed on the second conductive layer 19 except the portion where the bonding pad 13 is formed. Then, as shown in FIG. 1E, to enhance the strength of the conductive wire 21, a nickel (Ni) plating 25 is performed on the surface of the conductive wire 21. As shown in FIG. 1F, a gold (Au) plating 27 is carried out on the nickel-plated portion of the conductive wire 21. The gold plating improves an electrical solder joint between the conductive wire 21 and a printed circuit board (PCB) when the CSP is mounted on the PCB, and prevents corrosion. An electroplating method can be used for plating nickel and gold. Finally, the photoresist 23 is removed and the first and second conductive layers 17 and 19 are removed except in the region where the bonding pad 13 is formed.

The conventional CSP fabrication method has the following disadvantages. In order to enhance the strength of the conductive wire 21 and the electrical solder joint, and in order to prevent corrosion, very difficult processes with associated high cost, such as sputtering, photoresist deposition and etching are required.

SUMMARY OF THE INVENTION

Accordingly, the present invention is directed to a fabrication method for a chip size semiconductor package that substantially obviates one or more of the problems due to limitations and disadvantages of the related art.

An object of the present invention is to provide a simpler and lower cost fabrication method for a chip size semiconductor package (CSP) by improving a plating method of a conductive wire of the CSP.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the fabrication method for a chip size semiconductor package includes the steps of bonding conductive wires on bonding pads formed on the upper surface of a semiconductor chip, putting the entire structure in an electrolyzer containing an electrolytic solution in such a manner that one end of each conductive wires is exposed outside of the electrolytic solution, attaching a plating electrode on the inner wall of the electrolyzer, attaching a conductive plate to serve as a common electrode to the one exposed end of each of the conductive wires, and connecting the conductive plate and the outer wall of the electrolyzer to a current source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
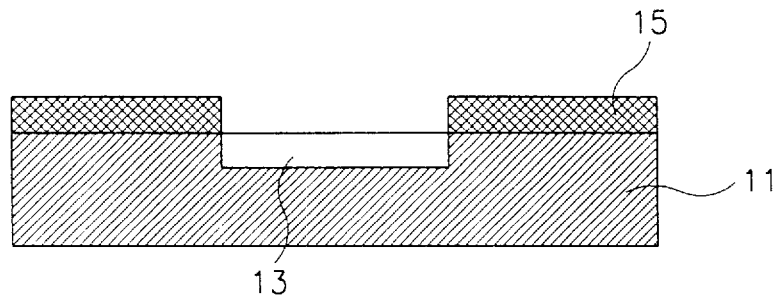
FIGS. 1A through 1F are longitudinal cross-sectional views showing a fabrication method of a CSP according to the conventional art.
Figure 1B:
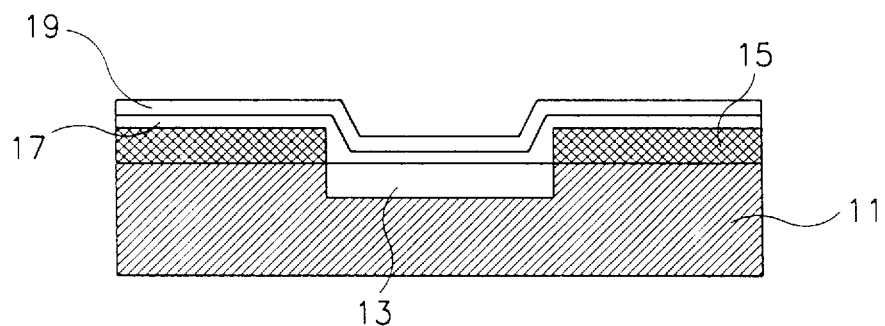
Figure 1C:
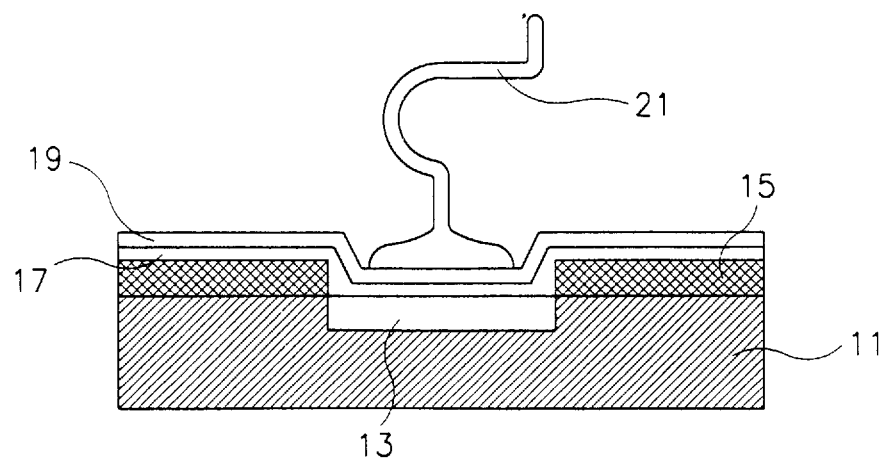
Figure 1D:
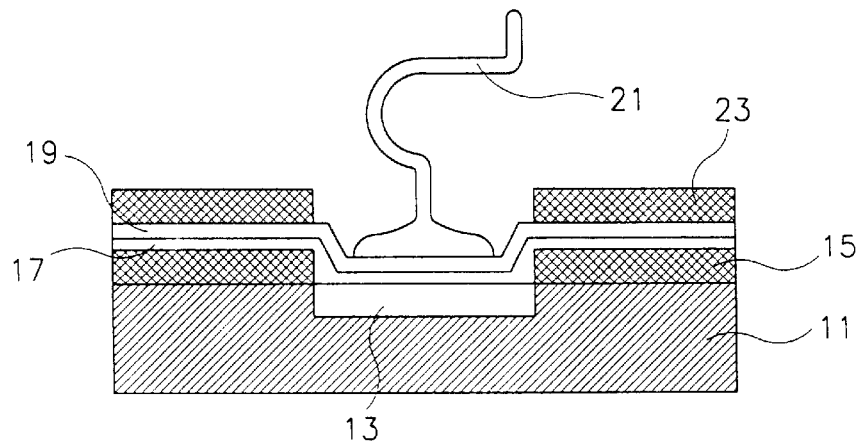
Figure 1E:
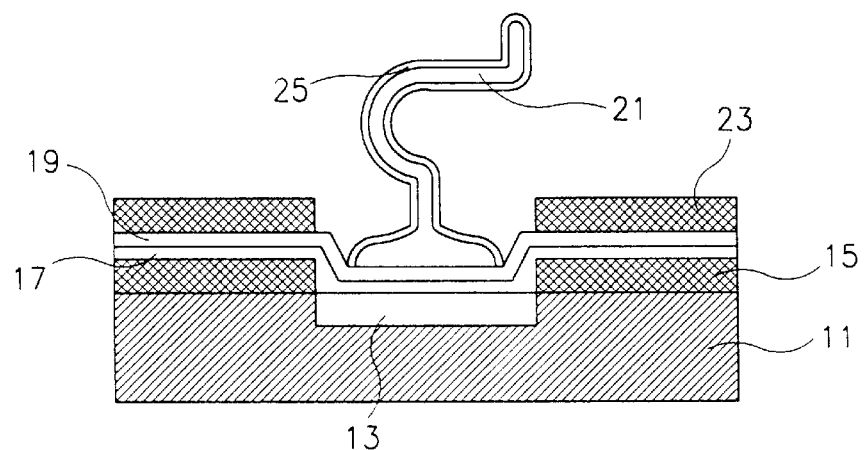
Figure 1F:
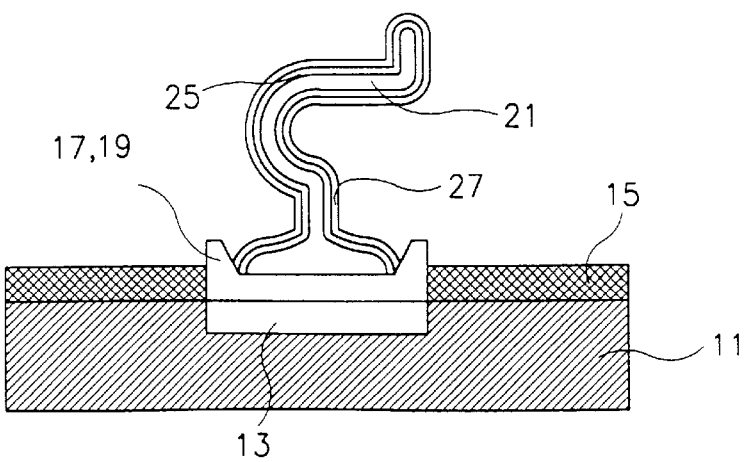
Figure 2A:
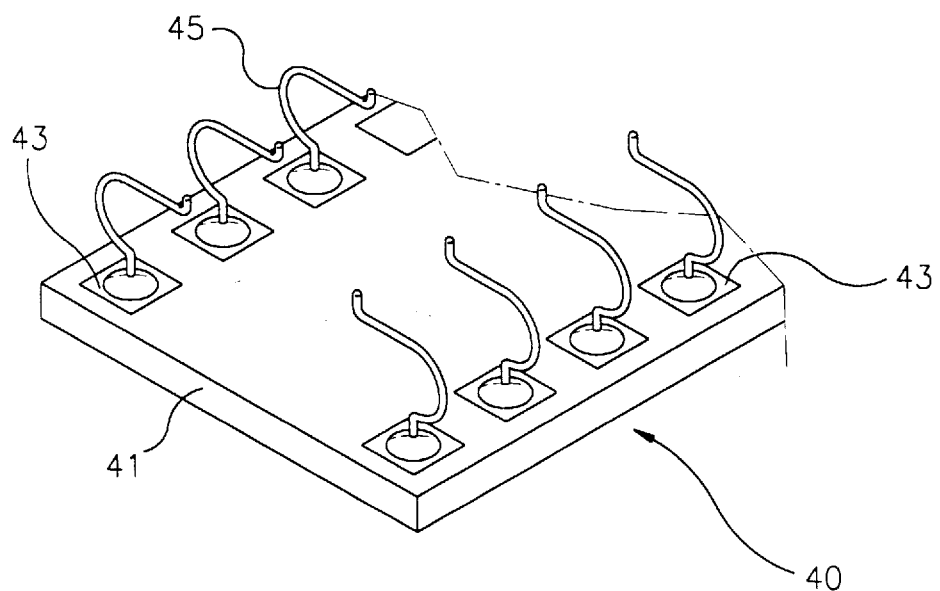
FIGS. 2A through 2E are longitudinal cross-sectional views showing a fabrication method of a CSP according to the present invention.

FIGS. 2A through 2E are longitudinal cross-sectional views showing the fabrication of a CSP according to the present invention. First, as shown in FIG. 2A, conductive wires 45 formed of gold (Au) are respectively bonded on a plurality of bonding pads 43 formed on a semiconductor chip 41.

Figure 2B:
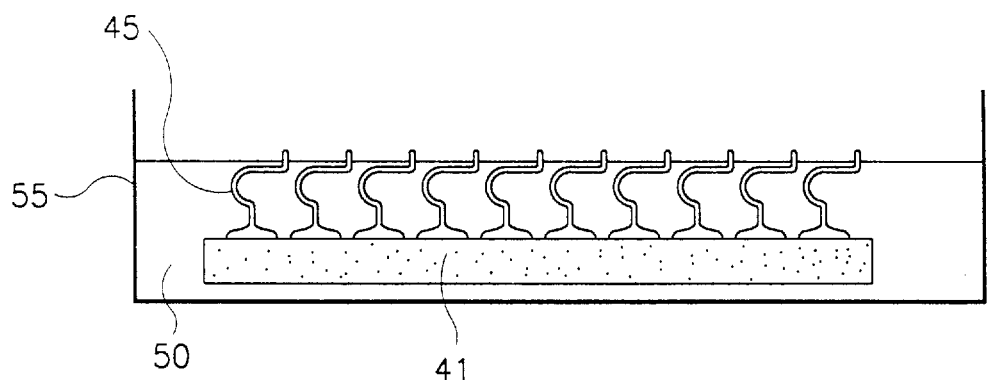

Then, as shown in FIG. 2B, the resultant semiconductor package 40 of FIG. 2A is put in an electrolyzer 55 containing an electrolytic solution 50 in such a manner that one end of each of the plurality of conductive wires 45 bonded on the semiconductor chip 41 is exposed outside of the electrolytic solution 50.

Figure 2C:
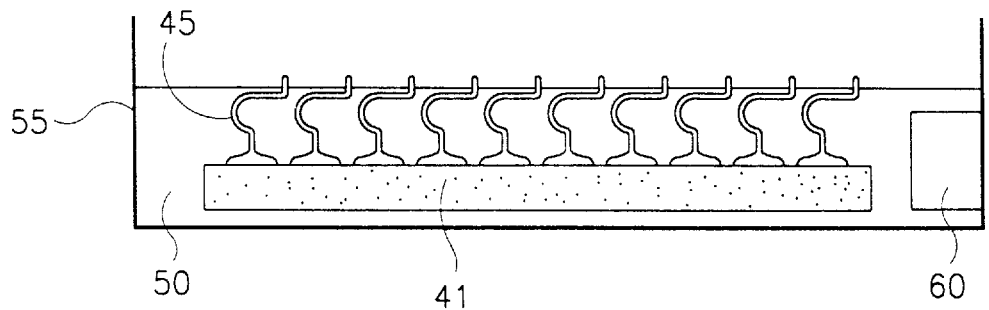

Then, as shown in FIG. 2C, a plating electrode 60, such as a nickel (Ni) electrode, is attached to the inner wall of the electrolyzer 55 in such a manner that the electrode 60 is entirely immersed in the electrolytic solution 50.

Figure 2D:
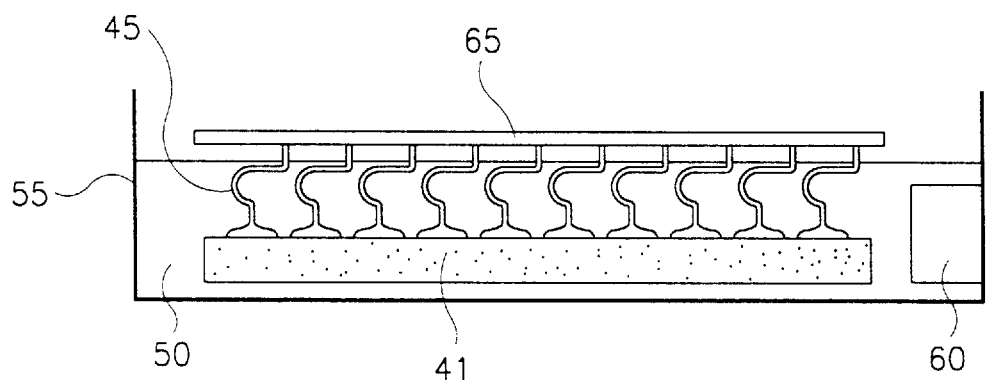

As shown in FIG. 2D, a conductive plate 65, to serve as a common electrode, is mounted on the exposed end of each of the conductive wires 45. The conductive plate 65 is preferably formed of copper (Cu).

Figure 2E:
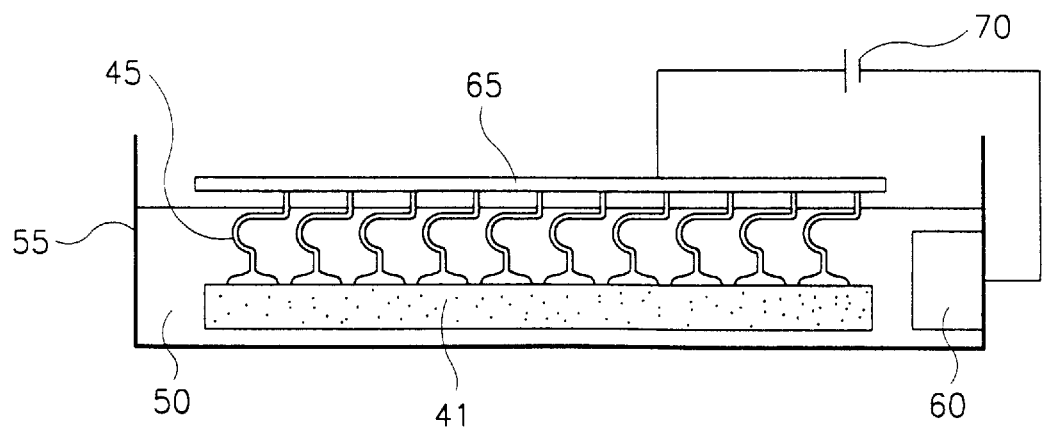

Next, as shown in FIG. 2E, the conductive plate 65 and the outer wall of the electrolyzer 55 are connected to an electric current source 70 to perform an electroplating process. The material of the electrode 60 immersed in the electrolyzer 55, i.e., nickel (Ni), is ionized, and the ionized nickel is plated on the surfaces of the conductive wires 45. After completing the nickel plating, the electric current source 70 is disconnected and the plating electrode 60 is replaced with a gold electrode and attached to the inner wall of the electrolyzer 55. The electric current source 70 is connected again, and the gold plating electrode is ionized. As a result, the ionized gold is plated on the surface of the nickel film formed on the surface of the conductive wires 45. That is, by substituting the electrode material 60, the surfaces of the conductive wires 45 can be plated with a particular material which a user needs.

According to the CSP fabrication method of the present invention, by performing an electroplating on the surface of the conductive wires using a simple system of an electrolyzer, and by choosing the particular material of the electrode, a simpler electroplating process with lower cost can be utilized to achieve the desired CSP fabrication.

It will be apparent to those skilled in the art that various modifications and variations can be made in the fabrication method for a chip size semiconductor package of the present invention without departing from the spirit or scope of the invention. Thus, it is intended that the present invention cover the modifications and variations of this invention provided they come within the scope of the appended claims and their equivalents.

What is claimed is:

1. A fabrication method for a semiconductor chip comprising the steps of:

bonding conductive wires on bonding pads formed on an upper surface of a semiconductor chip;

putting the semiconductor chip including the bonded conductive wires in an electrolyzer containing an electrolytic solution in such a manner that one end of each of the conductive wires is exposed outside of the electrolytic solution;

attaching a first plating electrode to an inner wall of the electrolyzer;

attaching a conductive plate to the exposed one end of each of the conductive wires; and connecting the conductive plate and an outer wall of the electrolyzer to an electric source.

2. The method of claim 1, further comprising the steps of:

disconnecting the electric source and replacing the first plating electrode with a second plating electrode;

attaching the conductive plate to the exposed one end of each of the conductive wires; and connecting the conductive plate and the outer wall of the electrolyzer to the electric source.

3. The method of claim 1, wherein the conductive wires include gold.

4. The method of claim 1, wherein the first plating electrode includes nickel.

5. The method of claim 1, wherein the conductive plate includes copper.

6. The method of claim 2, wherein the second plating electrode includes gold.

7. A method for fabricating a semiconductor chip, comprising the steps of:

bonding a plurality of conductive wires on a plurality of bonding pads formed on a semiconductor chip; and first electroplating a first conductive material on the plurality of conductive wires by immersing the semiconductor chip including the bonded conductive wires in an electrolyzer containing an electrolytic solution.

8. The method of claim 7, further comprising the step of:

second electroplating a second conductive material on the plurality of conductive wires by immersing the semiconductor chip including the bonded conductive wires in an electrolyzer containing an electrolytic solution.

9. The method of claim 7, wherein the step of electroplating includes the steps of:

immersing the semiconductor chip including the bonded conductive wires in the electrolytic solution so that one end of each of the conductive wires is exposed outside of the electrolytic solution;

attaching a first plating electrode to an inner wall of the electrolyzer;

attaching a conductive plate to the exposed one end of each of the conductive wires; and connecting the conductive plate and an outer wall of the electrolyzer to an electric source.

10. The method of claim of 7, wherein the conductive wires include gold.

11. The method of claim 7, wherein the first conductive material includes nickel.

12. The method of claim 8, wherein the second conductive material includes gold.

13. The method of claim 9, wherein the conductive plate includes copper.

14. The method of claim 7, further comprising the step of forming the plurality of bonding pads on the semiconductor chip prior to the step of bonding the plurality of conductive wires on the plurality of bonding pads.

* * * * *